United States Patent [19]

Kobayashi

[11] Patent Number: 5,721,446
[45] Date of Patent: Feb. 24, 1998

[54] SEMICONDUCTOR PRESSURE SENSOR WITH SPACING MEMBER DISPOSED BETWEEN SENSOR AND SUBSTRATE

[75] Inventor: Eiji Kobayashi, Itami, Japan

[73] Assignee: Mitsubishi Denki Kabushiki Kaisha, Tokyo, Japan

[21] Appl. No.: 834,275

[22] Filed: Apr. 15, 1997

Related U.S. Application Data

[63] Continuation of Ser. No. 456,483, Jun. 1, 1995, abandoned.

[30] Foreign Application Priority Data

Jan. 19, 1995 [JP] Japan ................................ 7-006512

[51] Int. Cl.⁶ .................................................. H01L 29/82
[52] U.S. Cl. ........................................ 257/419; 257/417
[58] Field of Search ............................... 257/419, 414, 257/417, 418; 73/720

[56] References Cited

FOREIGN PATENT DOCUMENTS

| | | | |
|---|---|---|---|
| 53-119693 | 10/1978 | Japan | 257/419 |
| 56-165361 | 12/1981 | Japan | 257/419 |
| 57-36870 | 2/1982 | Japan | 257/419 |

*Primary Examiner*—Jerome Jackson
*Assistant Examiner*—Nathan K. Kelley
*Attorney, Agent, or Firm*—Leydig, Voit & Mayer, Ltd.

[57] ABSTRACT

In a semiconductor pressure sensor reducing the stress applied by a thick film substrate and preventing the rising of a die bonding material, a sensor chip having a thin wall diaphragm is fixed to a thick film substrate by a die bonding material, such as silicone resin. A convex member of a glass material is interposed between the thick film substrate and the sensor chip and fixed by the die bonding material. With this arrangement, unintended deformation of the diaphragm of the sensor chip can be prevented and a highly accurate, less expensive semiconductor pressure sensor can be provided.

5 Claims, 2 Drawing Sheets

SEMICONDUCTOR PRESSURE SENSOR WITH SPACING MEMBER DISPOSED BETWEEN SENSOR AND SUBSTRATE

This disclosure is a continuation of patent application Ser. No. 08/456,483, filed Jun. 1, 1995, now abandoned.

BACKGROUND OF THE INVENTION

1. Field of the Invention

The present invention relates to a semiconductor pressure sensor, and more specifically, to a highly accurate less expensive semiconductor pressure sensor.

2. Description of the Related Art

FIG. 6 is a cross sectional view showing a main part of a conventional semiconductor pressure sensor. In FIG. 6, a thin wall diaphragm 3a is formed at the center of a sensor chip 3 which is fixed to a thick wall substrate 1 by a die bonding material 5 such as, for example, a die bonding resin. A pressure introducing hole 1a for introducing a pressure is confined to the portion of the thick film substrate 1 corresponding to the diaphragm 3a. Further, a thick film electrode 1b is disposed on to the thick film substrate 1 and electrically connected to the electrode (not shown) of the sensor chip 3 by a metal thin wire 4. In addition, a lead (not shown) is provided on the thick film substrate 1 to electrically connect the thick film electrode 1b to an external circuit, and a cover (not shown) is disposed on the thick film substrate 1 to cover the sensor chip 3.

The conventional semiconductor pressure sensor arranged as described above receives the pressure of a gas or liquid to be measured by the diaphragm 3a through the pressure introducing hole 1a. The diaphragm 3a is deformed in accordance with the pressure and the pressure is detected by the change of the resistance of a piezoresistance member (not shown) on the diaphragm 3a. Therefore, in order to provide a highly accurate semiconductor pressure sensor, factors that deform the diaphragm 3a must be suppressed to a minimum level in the structure and in the assembly of the semiconductor pressure sensor.

The aforesaid semiconductor pressure sensor has a problem in that the diaphragm 3a is deformed by thermal stress caused by the difference between the respective coefficients of linear expansion of the thick film substrate 1 and the sensor chip 3 composed of, for example, silicon. Further, there is also a problem that since the die bonding material 5 for fixing the sensor chip 3 on the thick film substrate 1 may rise from the thick film substrate 1 on the sensor chip 3 to the vicinity of the diaphragm 3a and became adhered thereto, deforming or constraining the diaphragm 3a.

SUMMARY OF THE INVENTION

An object of the present invention made to solve the above problems is to provide a highly accurate and less expansive semiconductor pressure sensor preventing deformation of the diaphragm.

According to the present invention, there is provided a semiconductor pressure sensor including a sensor chip having a center diaphragm and mounted on a thick film substrate which comprises a convex member where the sensor chip is mounted on said thick film substrate and a space between said thick film substrate and said sensor chip of at least several tens of microns.

DESCRIPTION OF PREFERRED EMBODIMENTS

Embodiment 1

Figure 1:
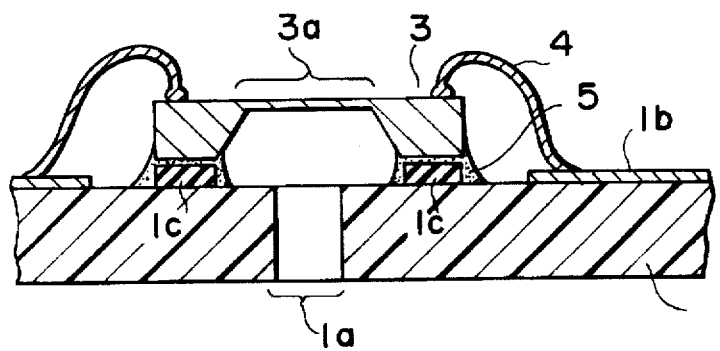
FIG. 1 is a side cross sectional view showing a main part of a semiconductor pressure sensor according to an embodiment of the present invention.

FIG. 1 is a side cross sectional view showing a main part of a semiconductor pressure sensor according to an embodiment 1 of the present invention. The same numerals used in respective drawings denote the same or corresponding parts. In FIG. 1, a thin wall diaphragm 3a is defined at the center of a sensor chip 3 which is fixed to a thick film substrate 1 by a die bonding material 5 such as, for example, a silicone resin. The sensor chip 3 is placed on a convex member 1c composed of a glass material and disposed on the thick film substrate 1 and fixed by the die bonding material 5.

A pressure introducing hole 1a for introducing a pressure is confined to the portion of the thick film substrate 1 corresponding to the diaphragm 3a. Further, a thick film electrode 1b is disposed on the thick film substrate 1 and electrically connected to an electrode (not shown) of the sensor chip 3 by a metal thin wire 4. In addition, a lead (not shown) is disposed on the thick film substrate 1 to electrically connect the thick film electrode 1b to an external circuit, and a cover (not shown) is disposed on the thick film substrate 1 to cover the sensor chip 3.

The semiconductor pressure sensor arranged as described above receives the pressure of a gas or liquid to be measured by the diaphragm 3a through the pressure introducing hole 1a. The diaphragm 3a is deformed in accordance with the pressure and the pressure is detected by the change of the resistance of a piezoresistance member (not shown) on the diaphragm 3a.

In the semiconductor pressure sensor of this embodiment, space between the thick film substrate 1 and the sensor chip 3 is several tens of microns such as, for example, 30–100 μm by the inclusion of the convex member 1c between the sensor chip 3 and the thick film substrate 1. With this arrangement, it is difficult for the stress of the thick film substrate 1 to be transmitted to the sensor chip 3 because the die bonding material 5 can absorb the stress. Further, the rising up of the die bonding material 5 to the vicinity of the diaphragm 3a on the chip 3 can be prevented. Consequently, the unintended deformation of the diaphragm 3a can be prevented by the above arrangement and a highly accurate semiconductor pressure sensor can be provided.

A glass material is used as the convex member 1c in the aforesaid arrangement. An over glass, cross glass, and the like may be used as the glass material and further the convex member 1c may be a conductor, resistor, or the like. In short, any material may be used as the convex member 1c so long as a predetermined space can be maintained between the thick film substrate 1 and the sensor chip 3. Therefore, the convex member 1c can be made by a conventional manufacturing process, so that the semiconductor pressure sensor can be provided at a low cost.

Embodiment 2

Figure 2:
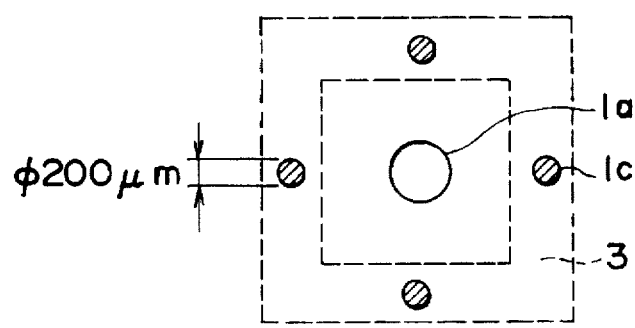
FIG. 2 is a plan partly cross sectional view showing a part of a semiconductor pressure sensor according to an embodiment of the present invention.

FIG. 2 is a plan partly cross sectional view showing a part of a semiconductor pressure sensor according to an embodiment 2 of the present invention. In FIG. 2, bump-shaped convex members 1c each having a diameter of 200 µm or more are disposed at three or more locations (four locations in FIG. 2) on the sensor chip 3 mounting portion (shown by a broken line in FIG. 2) of the thick film substrate 1.

Since a predetermined space can be maintained between the thick film substrate 1 and the sensor chip 3 and the bonding area of the chip 3 can be reduced by using the bump-shaped convex members 1c in this embodiment, the rising up of a die bonding material 5 to the vicinity of a diaphragm 3a and the deformation of the diaphragm 3a can be prevented. The number of locations where the bump-shaped convex members 1c are disposed is not limited so long as it is three or more locations and it may be eight locations or twelve locations and a plurality of the bump-shaped convex members 1c may be suitably disposed.

Embodiment 3

Figure 3:
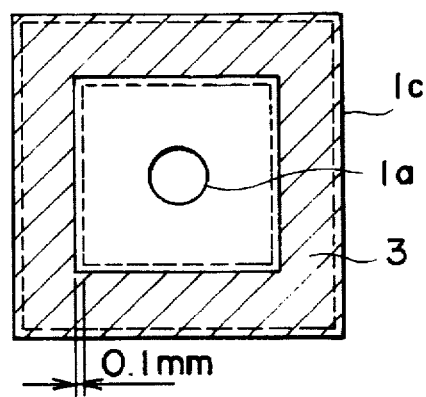
FIG. 3 is a plan partly cross sectional view showing a part of a semiconductor pressure sensor according to an embodiment of the present invention.

FIG. 3 is a plan partly cross sectional view showing a part of a semiconductor pressure sensor according to an embodiment 3 of the present invention. In FIG. 3, a generally annular, rectangular convex member 1c has inner and outer, generally rectangular, peripheral edges. The convex member 1c is dimensioned so that the outer periphery is disposed at a location extending outwardly from the sensor chip 3 on the thick film substrate 1 and the inner periphery is outwardly spaced from an inner periphery of the sensor chip 3 by 0.1 mm or more.

Since a predetermined space can be maintained between the thick film substrate 1 and the sensor chip 3 and the rising of a die bonding material 5 to the vicinity of a diaphragm 3a can be prevented by the rectangular convex member 1c in this embodiment, the deformation of the diaphragm 3a can be prevented.

Embodiment 4

Figure 4:
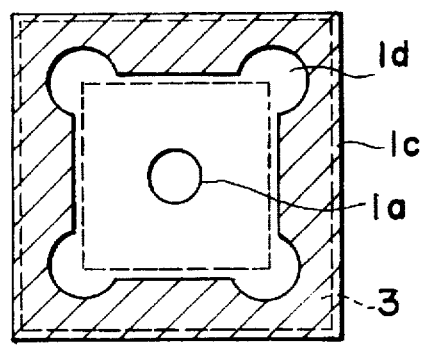
FIG. 4 is a plan partly cross sectional view showing a part of a semiconductor pressure sensor according to an embodiment of the present invention.

FIG. 4 is a plan partly cross sectional view showing a part of a semiconductor pressure sensor according to an embodiment 4 of the present invention. In FIG. 4, die bonding material holding recesses 1d are defined at the four corners of the inner periphery of the convex member 1c shown in FIG. 3.

Since the recesses 1d are located at the four corners of the sensor chip 3 mounting portion where the rising of the die bonding material 5 is liable to occur, the rising of the die bonding material 5 can be more reliably prevented.

Embodiment 5

Figure 5:
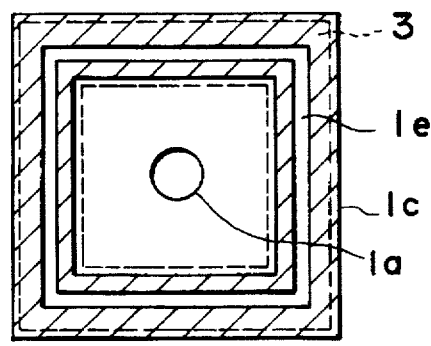
FIG. 5 is a plan partly cross sectional view showing a part of a semiconductor pressure sensor according to an embodiment of the present invention.
Figure 6:
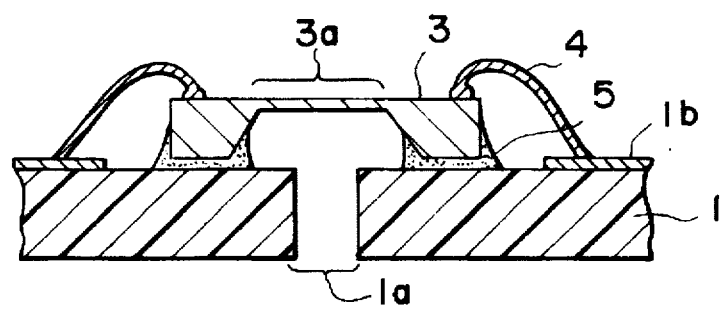
FIG. 6 is a side cross sectional view showing a part of a conventional semiconductor pressure sensor.

FIG. 5 is a plan partly cross sectional view showing a part of a semiconductor pressure sensor according to an embodiment 5 of the present invention. In FIG. 5, a circumferential groove 1e about 0.2 mm wide is defined in each side of the rectangular convex member 1c between the inner and outer peripheries, as shown in FIG. 3.

Since the bonding area of the die bonding material 5 can be reduced by the provision of the groove 1e in this embodiment, not only the rising of the die bonding material 5 but also the application of a stress to a diaphragm 3a can be sufficiently prevented.

What is claimed is:

1. A semiconductor pressure sensor comprising:

a thick film substrate;

a sensor chip having a central diaphragm and disposed on said thick film substrate;

a spacing member disposed between said sensor chip and said thick film substrate, maintaining a space between said thick film substrate and said sensor chip of at least several tens of microns, said spacing member having inner and outer peripheries, the inner periphery being larger than and spaced from an inner periphery of said sensor chip; and a die bonding resin bonding said sensor chip and said spacing member to said thick film substrate.

2. The semiconductor pressure sensor according to claim 1 wherein the inner periphery is larger than and spread from the inner periphery of said sensor chip by at least 0.1 mm.

3. The semiconductor pressure sensor according to claim 1 wherein the inner periphery is generally rectangular, has four straight sides, and has recesses at corners where the four straight sides of the inner periphery would intersect if extended.

4. The semiconductor pressure sensor according to claim 1 wherein said spacing member includes a circumferential groove between the inner and outer peripheries.

5. The semiconductor pressure sensor according to claim 1 wherein said spacing member includes a generally rectangular outer periphery extending outwardly beyond said sensor chip on said thick film substrate.

* * * * *